US007009883B2

(12) United States Patent
Turner et al.

(10) Patent No.: US 7,009,883 B2
(45) Date of Patent: Mar. 7, 2006

(54) AUTOMATIC PROGRAMMING TIME SELECTION FOR ONE TIME PROGRAMMABLE MEMORY

(75) Inventors: Tony M. Turner, Foothill, CA (US); Myron Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 95 days.

(21) Appl. No.: 10/696,356

(22) Filed: Oct. 30, 2003

(65) Prior Publication Data

US 2004/0170059 A1    Sep. 2, 2004

Related U.S. Application Data

(60) Provisional application No. 60/449,856, filed on Feb. 27, 2003.

(51) Int. Cl.
*G11C 16/00*    (2006.01)
(52) U.S. Cl. .......................... 365/185.22; 365/185.19; 365/185.28
(58) Field of Classification Search ........... 365/185.22, 365/185.19, 185.24, 185.28
See application file for complete search history.

(56) References Cited

U.S. PATENT DOCUMENTS

| 5,467,309 | A  | * | 11/1995 | Tanaka et al. ......... 365/185.14 |
| 5,991,201 | A  | * | 11/1999 | Kuo et al. ............. 365/185.19 |
| 6,396,738 | B1 | * | 5/2002  | Tamada et al. ........ 365/185.19 |
| 6,525,955 | B1 |   | 2/2003  | Smith et al. |
| 6,693,819 | B1 |   | 2/2004  | Smith et al. |
| 6,700,176 | B1 |   | 3/2004  | Ito et al. |
| 6,704,236 | B1 |   | 3/2004  | Buer et al. |
| 6,902,958 | B1 |   | 6/2005  | Ito et al. |

\* cited by examiner

*Primary Examiner*—Tan T. Nguyen
(74) *Attorney, Agent, or Firm*—Sterne, Kessler, Goldstein & Fox P.L.L.C.

(57) ABSTRACT

A method of programming a memory includes the steps of attempting to program a bit at a designated address for a predetermined time; testing the bit to see if it has been programmed; increasing the predetermined time by approximately an order of magnitude; repeating the previous steps (until the bit at the designated address is programmed; and repeating all the previous steps by advancing the designated address until all bits in the memory are programmed.

4 Claims, 1 Drawing Sheet

Figure 1:
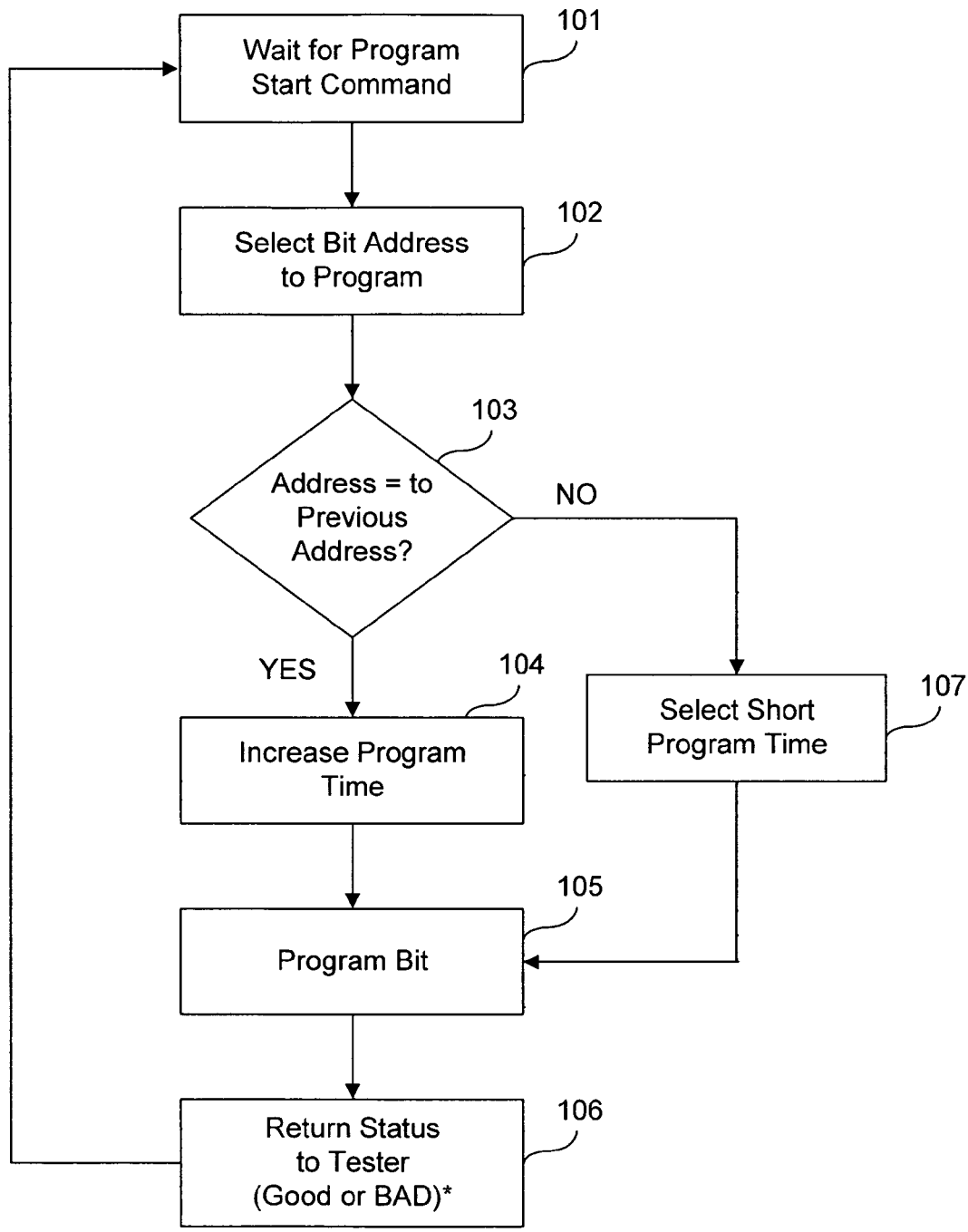

\* If BAD Status is Returned Tester will Attempt to Program the same bit again.

\* If BAD Status is Returned Tester will Attempt to Program the same bit again.

AUTOMATIC PROGRAMMING TIME SELECTION FOR ONE TIME PROGRAMMABLE MEMORY

CROSS REFERENCE TO RELATED APPLICATIONS

This application claims priority to U.S. Provisional Patent Application No. 60/449,856, filed on Feb. 27, 2003, entitled AUTOMATIC PROGRAMMING TIME SELECTION FOR ONE TIME PROGRAMMABLE MEMORY, which is incorporated by reference herein.

This application incorporates by reference U.S. Pat. No. 6,525,955, entitled "Memory Cell With Fuse Element", U.S. patent application Ser. No. 10/038,021, filed on Jan. 3, 2002, U.S. patent application Ser. No. 10/041,296, filed on Jan. 8, 2002, and U.S. patent application Ser. No. 10/197,437, filed on Jul. 18, 2002.

BACKGROUND OF THE INVENTION

1. Field of the Invention

The present invention relates to one-time programmable (OTP) memories, and more particularly, to a more efficient system and method for programming the memories faster.

2. Related Art

The OTP memory has a gate oxide barrier that can be broken down by applying a voltage to one side of the gate. When the barrier is broken down, the resistance to the power rail (or the ground rail) becomes lower and the value is forever stored in the OTP bit. The value is either a 1 or 0.

The time required to break down the barrier and program the bit is variable depending on the fabrication process of the silicon. Some memories require a longer programming time to program a bit if the wafer process is skewed to one corner of the fabrication process. Other memories will program in shorter periods of time.

Thus, a particular problem that exists is the non-uniformity in programming time for one-time programmable memories. For example, a wafer or a particular programmable memory might have 99% of its bits that may be programmed in a fairly short time, for example, 10 $\mu$sec. However, a handful of bits are such that they require much longer programming, sometimes as long as 1 sec. For a 1K-bit programmable memory, using the lowest common denominator, or in this case, the longest possible time required to program any bit as the time to program all the bits, means that for a 1K-bit memory, 1000 seconds would be required to program it. This means that the throughput of the programming device used to program the memories is extremely low, causing an increase in the cost of manufacturing of the memories.

Tester time is costly, so a method is needed to determine the minimum amount of programming time to use on the tester.

BRIEF SUMMARY OF THE INVENTION

Accordingly, the present invention is directed to automatic programming time selection for one time programmable memory that substantially obviates, one or more of the disadvantages of the related art.

There is provided a method of programming a memory including the steps of attempting to program a bit at a designated address for a predetermined time; testing the bit to see if it has been programmed; increasing the predetermined time by approximately an order of magnitude; repeating the previous steps (until the bit at the designated address is programmed; and repeating all the previous steps by advancing the designated address until all bits in the memory are programmed.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings:

FIG. 1 illustrates the proposed programming method according to the present invention.

DETAILED DESCRIPTION OF THE INVENTION

Reference will now be made in detail to the preferred embodiments of the present invention, examples of which are illustrated in the accompanying drawings.

The programming of a bit in the OTP memory done based on time. If a bit is programmed for time X (e.g., 10 $\mu$sec), and the tester returns a GOOD status, the programming of the bit is done. If the time X program cycle is complete, and the bit is not programmed correctly yet, the programming can be done again (and again) until it returns a GOOD status. The gate oxide barrier of the OTP memory will have lower and lower resistance with each programming attempt. However lab results show that if a bit fails the first attempt, the subsequent attempts must be longer in duration to reach success.

The algorithm is implemented in logic that will select the program time based on seeing the same bit get programmed repeatedly. On the first attempt, a default time is selected. On the second attempt, the address of the bit is compared and found to be the same location, then the programming time is extended by approximately an order of magnitude. On the third attempt, if the address is the same again, the program time is extended even longer. The process can continue.

After the bit returns a GOOD status, the programming can move on to another bit and the time can drop back to the shorter default value.

FIG. 1 illustrates a flow diagram of the programming method of the present invention. As shown in FIG. 1, the programming apparatus waits for a program Start command (step 101). Upon the Start command, a bit address is selected for programming (step 102). If the address is equal to the previous address (step 103), program time is increased (step 104). The bit is then programmed (step 105). On the next step, the status of the bit (Good or Bad) is returned to the tester (step 106). The tester then returns back to step 101. If, at step 103, the address is not equal to the previous address, a short (i.e., default or standard) program time is selected (step 107). The bit is then programmed (see step 105, etc.)

By automatically selecting a longer program time for bits which require it and automatically selecting a short time for those bits that program quickly, tester time is saved, and no user intervention is needed. This algorithm also applies to "in system" programming as well, where time is not important, but success of programming is important.

As an alternative, a set of bits can be used to determine the wafer process. These bits are programmed once for a short period. If any bits fail, then the wafer is assumed to be slow to program and a configuration bit (or bits) in the OTP is then programmed that will cause all future program times to be extended by roughly an order of magnitude.

Thus, the default starting point for the program time can be selected based on the wafer process.

For example, if a "slow to program" part is found during the test bit programming, this part would then have all its bits programmed in the OTP memory to have programming times longer than a "short to program" part. This will be true for tester as well as in system programming.

The programming method of the present invention tests each bit to see whether it belongs to a fast programmable bit or a slow programmable bit. Most bits are typically of the fast programming type, and may be programmed, for example, in 10–20 $\mu$sec. In that case, the method involves programming a bit that corresponds to a given address, and then testing to see if the bit has in fact been programmed during the 10 $\mu$sec. If the bit programming was successful, then the programming apparatus moves onto the bit at the next address. If the programming has not been successful, then the tester increases the time required to program that particular bit by, for example, a factor of 10. The tester then tries again to program the bit. Following the next attempt, the tester again checks to see if the bit has been successfully programmed. If it has, then it moves onto the bit at the next address. If it has not, then it again increases the time required to program this particular bit by, for example, a factor of 10, and the process repeats itself.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of programming a memory comprising:
    (a) attempting to program a bit at a designated address for a predetermined time;
    (b) testing the bit to see if it has been programmed;
    (c) increasing the predetermined time by approximately an order of magnitude;
    (d) repeating steps (a)–(c) until the bit at the designated address is programmed; and
    (e) repeating steps (a)–(d) by advancing the designated address until all bits in the memory are programmed.

2. The method of claim 1, further including the step of testing selected bits of the memory, and defining the initial predetermined time based on the testing.

3. A method of programming a memory comprising:
    (a) attempting to program a bit for a predetermined program time;
    (b) testing the bit to see if the bit has been programmed;
    (c) repeating steps (a)–(b) with a program time that is increased by an order of magnitude until the bit is programmed;
    (d) repeating steps (a)–(c) by advancing to a next address until all bits are programmed.

4. The method of claim 3, further including the step of testing selected bits of the memory, and defining the initial predetermined time based on the testing.

* * * * *

UNITED STATES PATENT AND TRADEMARK OFFICE
CERTIFICATE OF CORRECTION

PATENT NO. : 7,009,883 B2
APPLICATION NO. : 10/696356
DATED : March 7, 2006
INVENTOR(S) : Turner et al.

Page 1 of 1

It is certified that error appears in the above-identified patent and that said Letters Patent is hereby corrected as shown below:

Title page,
Item [75], Inventors, "Foothill, CA" should be -- Foothill Ranch, CA --.
Item [57], ABSTRACT,
Line 6, "programmed;" should be -- programmed); --.

Column 1,
Line 15, "Jan. 3, 2002," should be -- Jan. 3, 2002, now U.S. Patent No. 6,704,236 B2, --.
Line 17, "2002, and" should be -- 2002, now U.S. Patent No. 6,693,819 B2, and --.
Line 18, "Jul. 18, 2002." should be -- Jul. 18, 2002, now U.S. Patent No. 6,700,176 B2. --.
Line 61, "obviates, one" should be -- obviates one --.

Column 2,
Line 2, "programmed;" should be -- programmed); --.
Lines 43-44, "However lab" should be -- However, lab --.

Column 3,
Line 2, "etc.)" should be -- etc.). --.

Column 4,
Line 32, "programming;" should be -- programming; and --.

Signed and Sealed this

Eleventh Day of July, 2006

JON W. DUDAS
*Director of the United States Patent and Trademark Office*